United States Patent
Pölzl et al.

(10) Patent No.: US 7,186,618 B2
(45) Date of Patent: Mar. 6, 2007

(54) POWER TRANSISTOR ARRANGEMENT AND METHOD FOR FABRICATING IT

(75) Inventors: Martin Pölzl, Alt-Ossiach (AT); Franz Hirler, Isen (AT); Oliver Häberlen, Villach (AT); Manfred Kotek, Villach (AT); Walter Rieger, Arnoldstein (AT)

(73) Assignee: Infineon Technologies AG, Munich (DE)

( * ) Notice: Subject to any disclaimer, the term of this patent is extended or adjusted under 35 U.S.C. 154(b) by 169 days.

(21) Appl. No.: 10/977,118

(22) Filed: Oct. 29, 2004

(65) Prior Publication Data

US 2005/0145936 A1    Jul. 7, 2005

(30) Foreign Application Priority Data

Oct. 30, 2003    (DE)    ................. 103 50 684

(51) Int. Cl.
*H01L 21/336*    (2006.01)
(52) U.S. Cl. ................. 438/270; 257/E21.419
(58) Field of Classification Search ............. 438/140, 438/270, 589; 257/E21.419
See application file for complete search history.

(56) References Cited

U.S. PATENT DOCUMENTS

| | | | |
|---|---|---|---|
| 5,597,765 A * | 1/1997 | Yilmaz et al. ....... | 257/E21.419 |
| 5,763,915 A | 6/1998 | Hshieh et al. | |
| 6,413,822 B2 * | 7/2002 | Williams et al. ............ | 438/270 |
| 6,462,376 B1 | 10/2002 | Wahl et al. | |
| 6,690,062 B2 | 2/2004 | Henninger et al. | |
| 2003/0178676 A1 | 9/2003 | Henninger et al. | |

FOREIGN PATENT DOCUMENTS

| | | |
|---|---|---|
| DE | 102 12 149 A1 | 10/2003 |
| EP | 0 722 189 A2 | 7/1996 |
| WO | WO 00/42665 | 7/2000 |

* cited by examiner

*Primary Examiner*—Chandra Chaudhari
(74) *Attorney, Agent, or Firm*—Maginot, Moore & Beck

(57) ABSTRACT

When fabricating trench power transistor arrangements (1) with active cell array trenches (5) and passive connecting trenches (6), the cell array trenches (5) are provided in greater width than the connecting trenches (6). An auxiliary layer (24) is deposited conformally onto a lower field electrode structure (11) in the cell array trenches (5) and the connecting trenches (6) and is etched back as far as the top edge in the connecting trenches (6), which removes it from the cell array trenches (5). The auxiliary layer (24) allows the gate oxide (20) to be patterned without a complex mask process. An edge trench (7), with an electrode, on the potential of the field electrode structure (11) shields the cell array (3) from a drain potential.

18 Claims, 11 Drawing Sheets

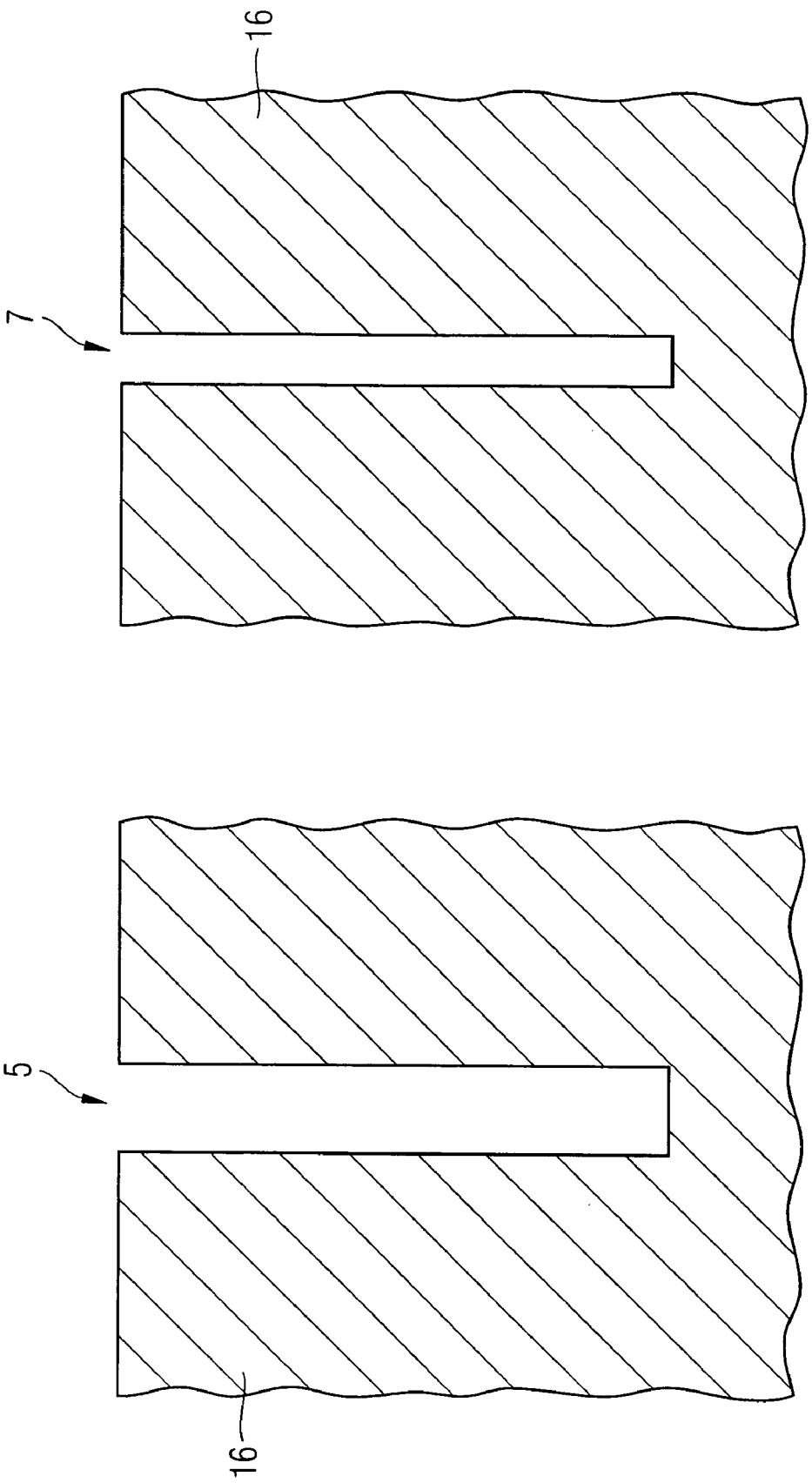

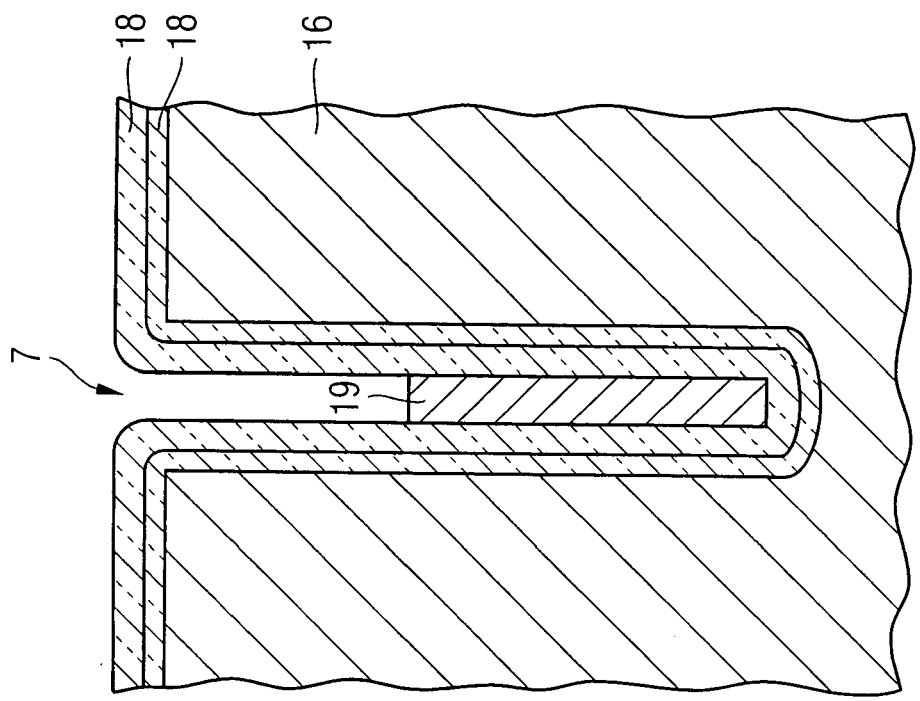
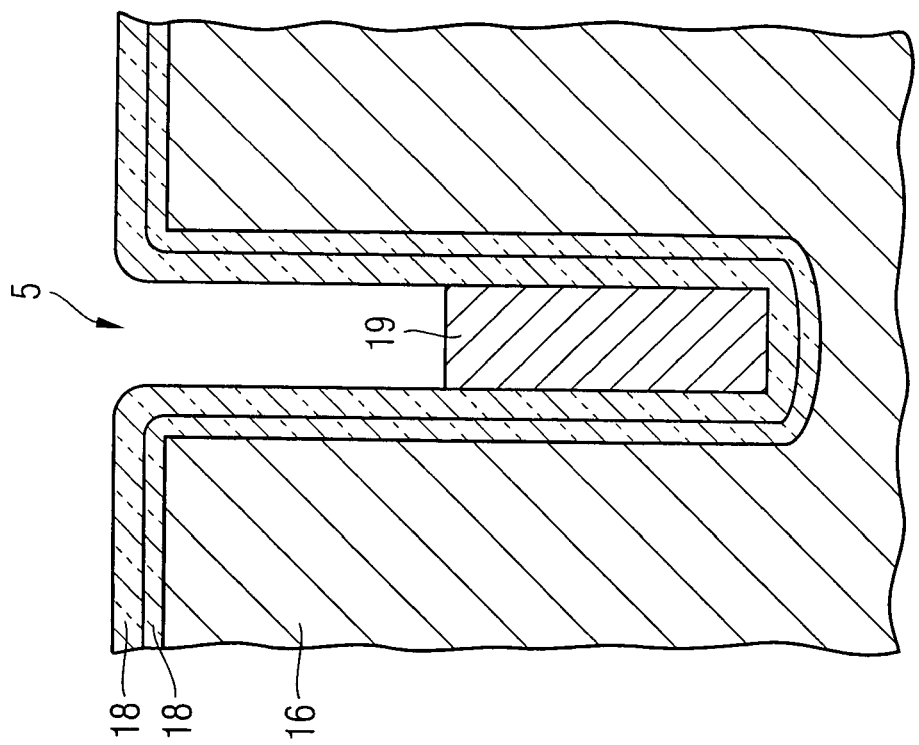
FIG 3B

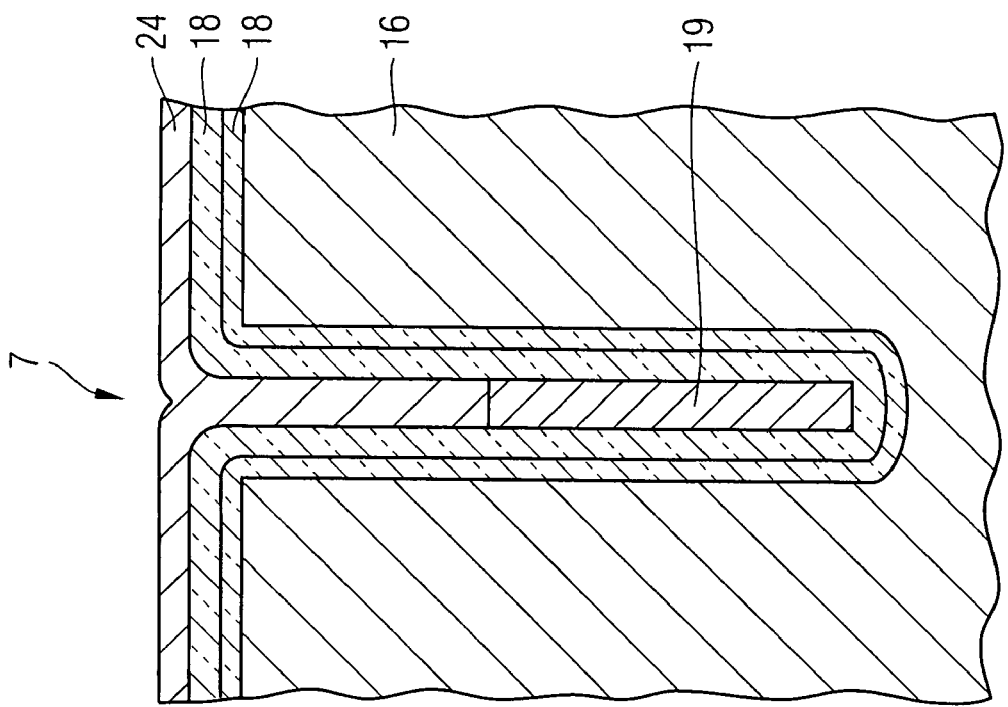
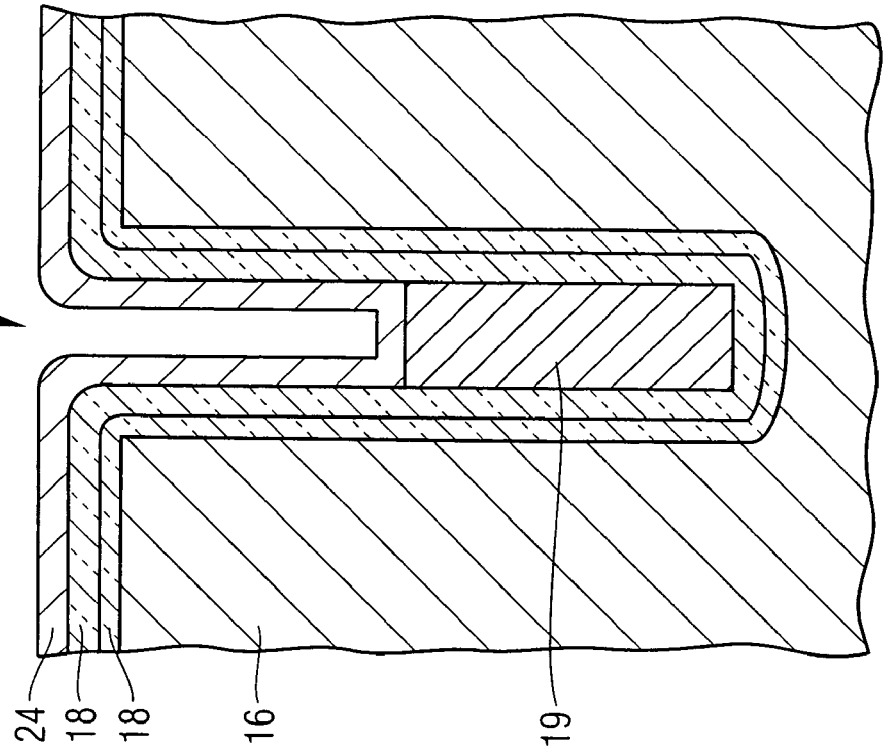
FIG 3C

FIG 3D
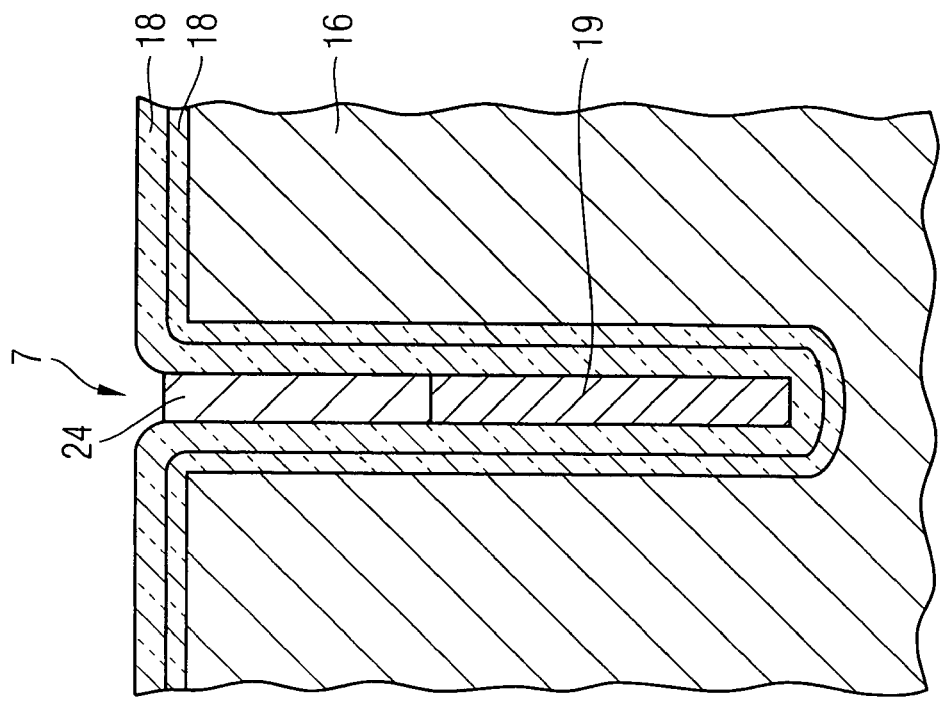
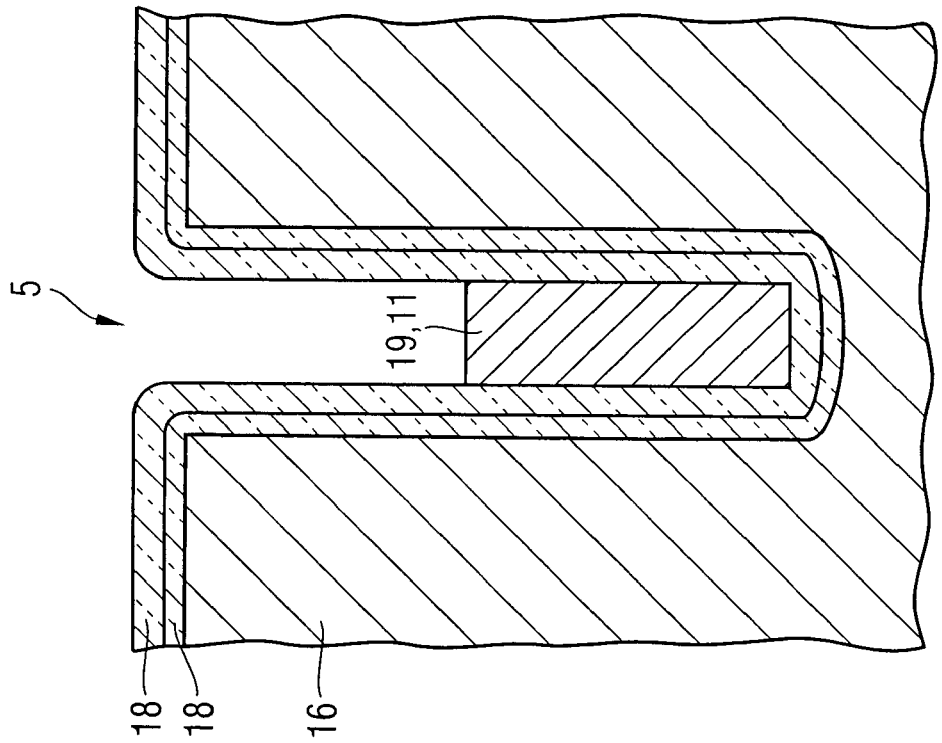

FIG 3E
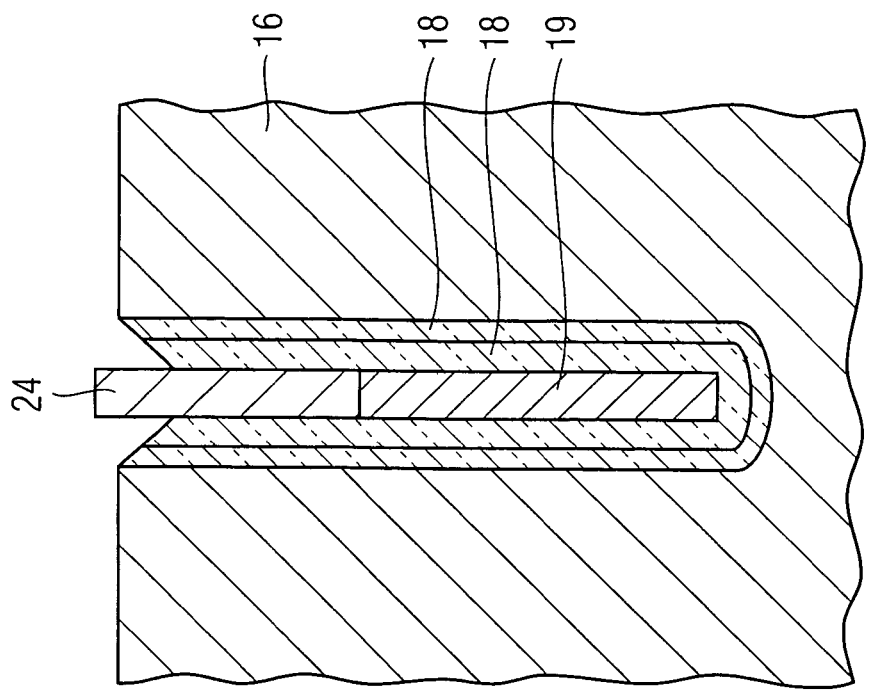
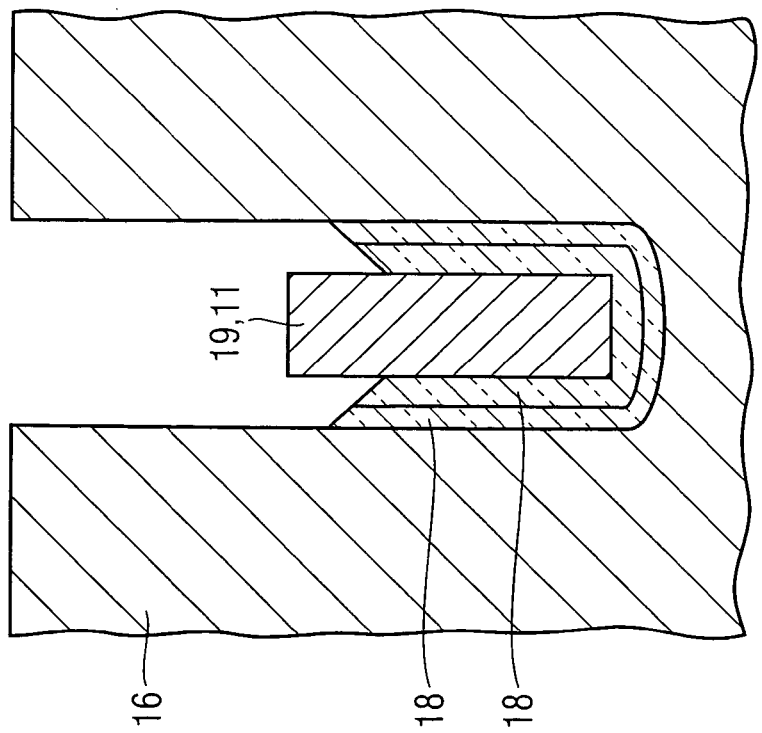

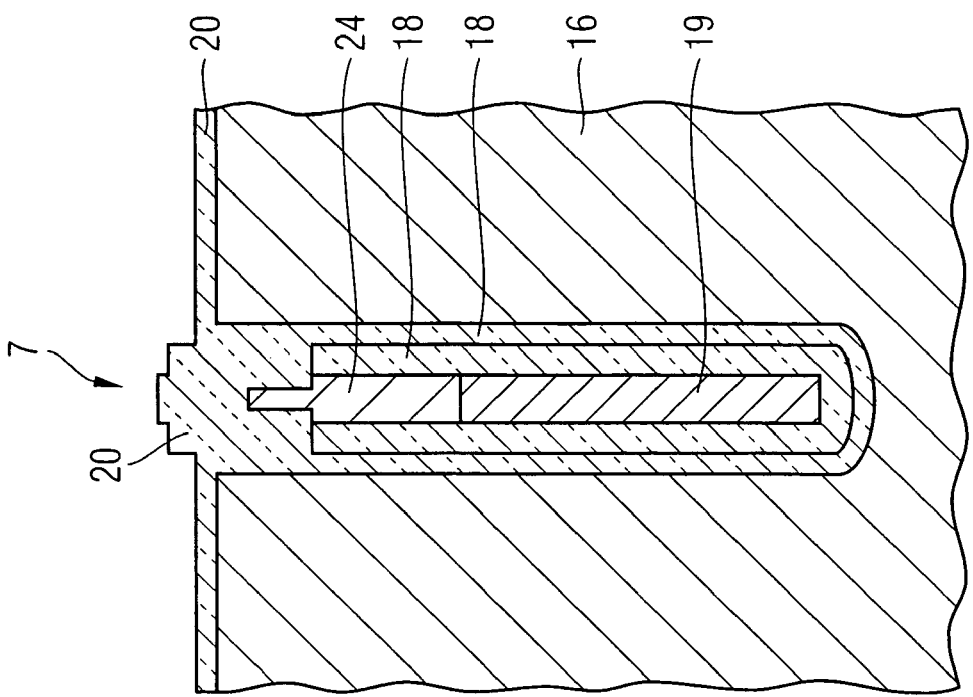
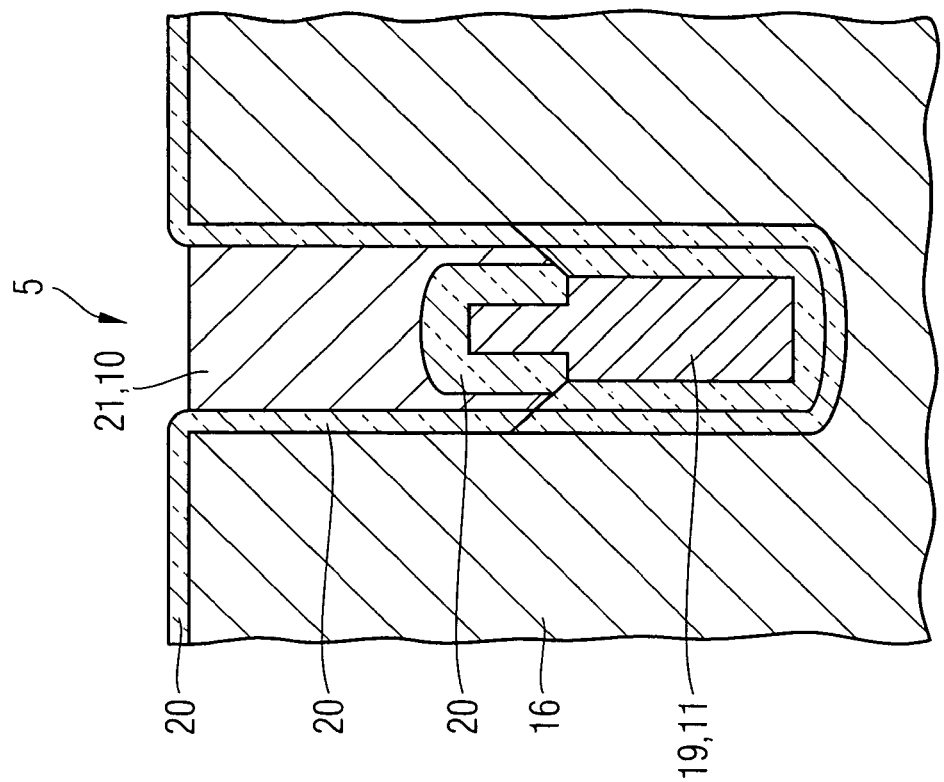
FIG 3F

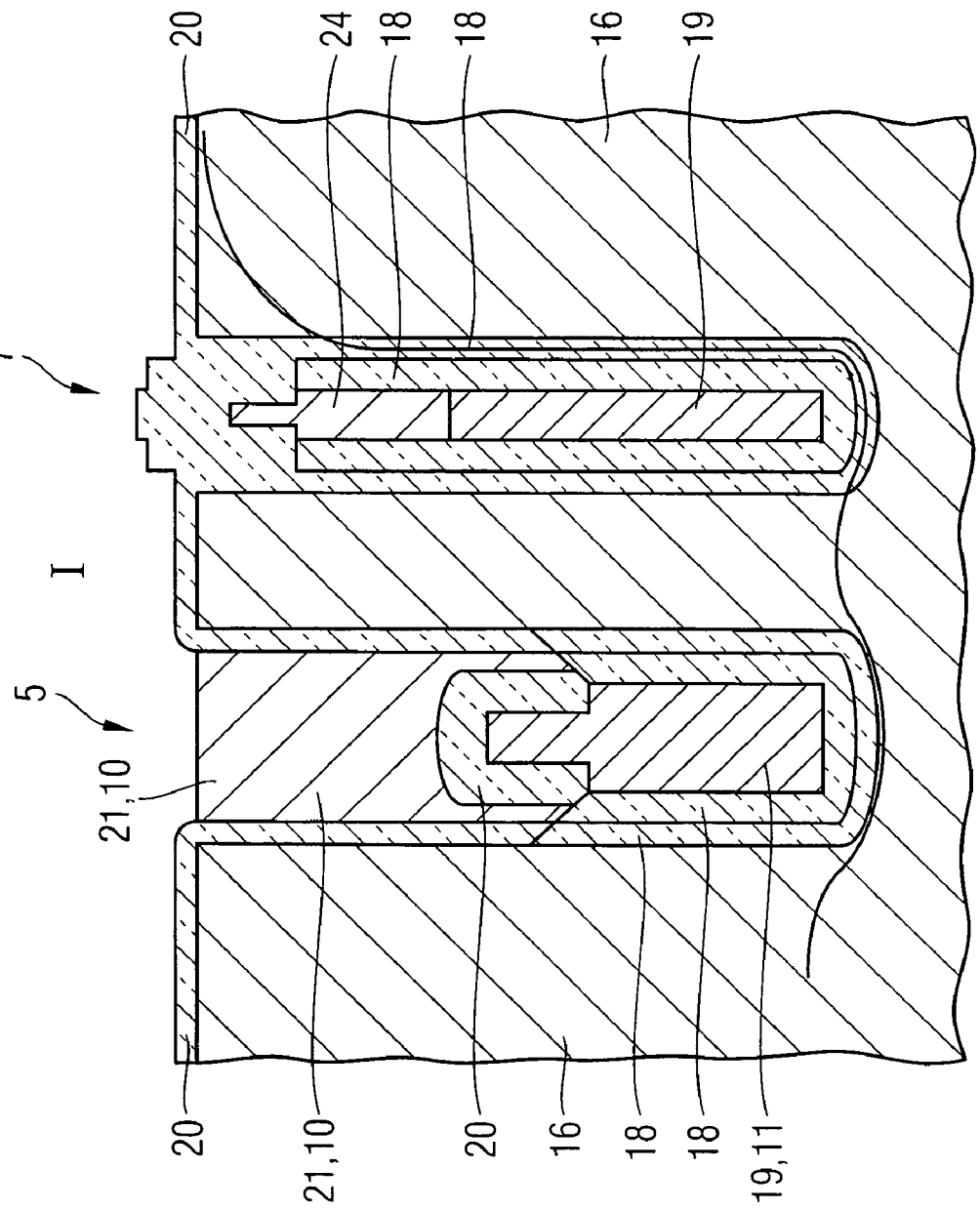

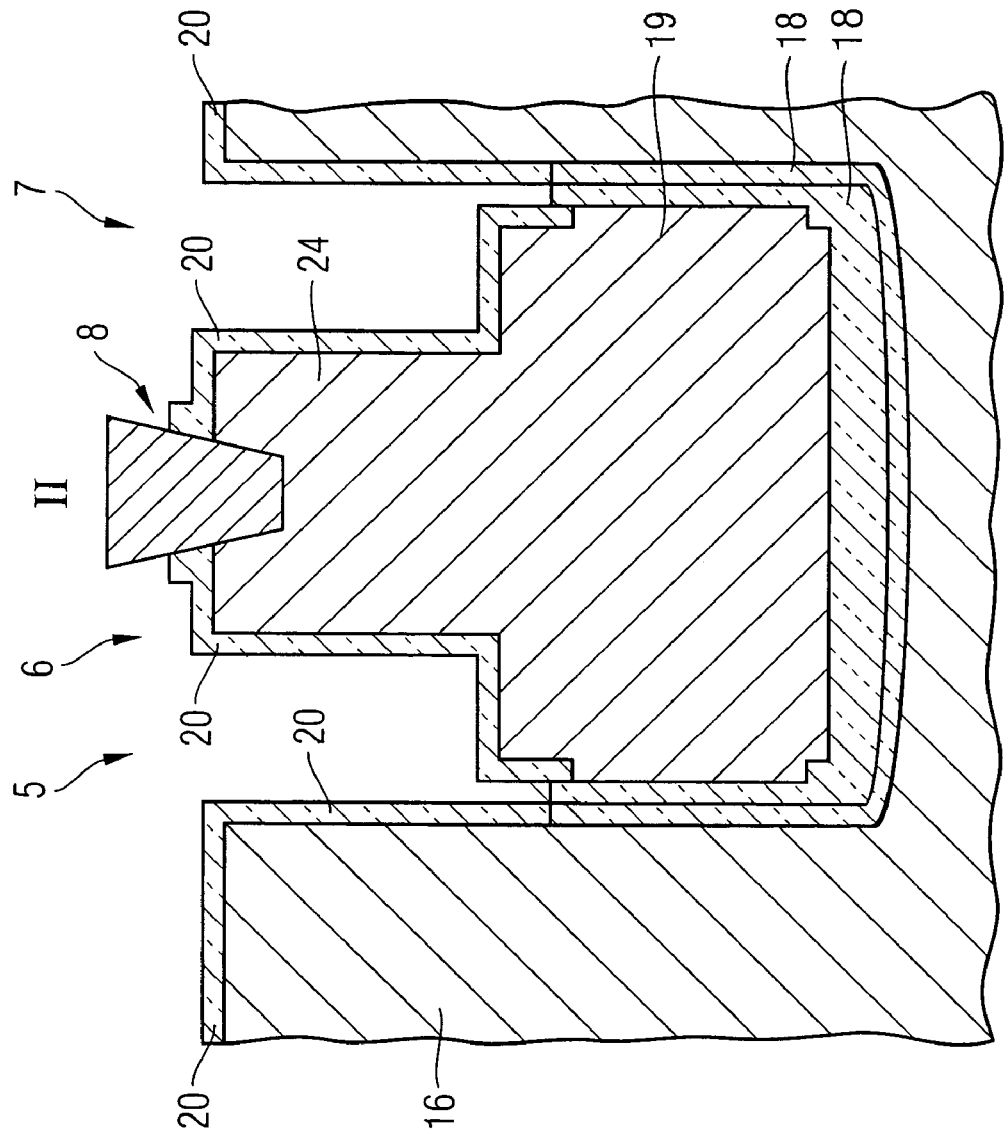

POWER TRANSISTOR ARRANGEMENT AND METHOD FOR FABRICATING IT

BACKGROUND

The invention relates to a method for fabricating a power transistor arrangement and to a method for fabricating a power transistor arrangement with a transistor edge termination. The invention also relates to a power transistor arrangement.

Transistor arrangements in the form of MOS (Metal Oxide Semiconductor) power transistors are provided for controlling switching currents at high current levels (up to several 10s of amps) using low control voltages. The withstand voltage of such power transistors may be up to several 100 V. The switching times are usually in the region of a few microseconds.

MOS power transistors are available in the form of trench MOS power transistors, for example. A trench MOS power transistor is formed in a semiconductor substrate which has a respective plurality of trench transistor cells arranged next to one another in at least one active cell array.

Depending on the design of the trench transistor cells, it is possible to provide normally-on and normally-off p-channel or n-channel trench MOS power transistors, for example.

FIG. 1 shows a conventional power transistor arrangement 1, in the form of a trench MOS power transistor, with a schematic illustration of the source, drain and gate connections, said power transistor being in the form of an n-channel MOSFET with a vertical, double-diffused trench structure (VDMOSFET, vertical double-diffused metal oxide semiconductor field effect transistor). In this case, a drain metallization 231 connected to the drain connection is arranged on the back of a semiconductor substrate 16. The drain metallization 231 is adjoined in the semiconductor substrate 16 by an $n^{++}$-doped drain layer 23. Opposite the drain metallization 231, the drain layer 23 is adjoined by a drift zone 232. The drift zone 232 is generally formed from a weakly n-doped portion of the semiconductor substrate 16, which is normally made of epitaxially applied silicon. When the trench MOS power transistor is in off-state mode, a space-charge zone whose extent essentially determines the maximum reverse voltage develops in the drift zone 232.

A cell array 3 contains cell array trenches 5 in the semiconductor substrate 16. In this example, the cell array trenches 5, which are shown in cross section, extend parallel in one direction at right angles to the cross-sectional face. The cell array trenches 5 contain gate electrode structures 10 and field electrode structures 11. The field electrode structure 11 is insulated from the semiconductor substrate 16 by an insulating layer 18 which is formed from a field oxide. The gate electrode structure 10 is insulated from the field electrode structure 11 and the semiconductor substrate 16 by a gate insulating layer 20 made of silicon oxide. The drift zone 232 of the semiconductor substrate 16 is adjoined in regions between the cell array trenches 5 by p-doped body zones which are opposite the gate electrode structures 10.

Provided between the body zones and a substrate surface 17 are $n^{++}$-doped source regions 8a. The field electrode structures 11 reduce a parasitic capacitance between the gate electrode structures 10 and the drift zone 232. Source contact trenches 8 are used to provide electrically conductive connections between a source metallization 15 and the source regions 8a. The source metallization 15 is electrically insulated from the gate electrode structures 10 by an intermediate oxide layer 22. The material both of the gate electrode structures 10 and of the field electrode structures 11 is highly doped polysilicon, for example. The conductivity of the gate electrode structure 10 may be improved by an additional layer in the gate electrode structure 10, for example a silicide layer. The cell array trench 5 with the gate electrode structure 10 and the field electrode structure 11 forms, together with the adjoining, doped regions of the semiconductor substrate 16, a trench transistor cell 2, which extends as far as the drain layer 23.

If the gate electrode structure 10 in an active trench transistor cell 2 of this type has a positive potential applied to it, then an n-conductive inversion channel forms in the p-doped body zone from the p-doped body zone's minority carriers (electrons) which are enriched there.

In an edge region 4 of the power transistor arrangement 1 in the form of a trench MOS power transistor, contact is made firstly between the field electrode structures 11 arranged in the cell array trenches 5 and the source metallization 15, and secondly contact is made between the gate electrode structures 10 arranged in the cell array trenches 5 and a gate metallization 14. In addition, an example of a shielding electrode 12 is shown in the edge region 4.

The contact between the field electrode structures 11 arranged in the cell array trenches 5 is made in a cross-sectional plane VII which is parallel to the cross-sectional plane VI. In the cell array trenches 5 running at right angles to the cross-sectional plane VI, the gate electrode structures 10 do not extend over the entire length of the cell array trenches 5, which means that contact with the respective field electrode structure 11 is made in a connecting region of the cell array trenches 5, as shown in the plane VII. Each field electrode structure 11 drawn over the substrate surface 17 is electrically conductively connected to the source metallization 15.

In a further cross-sectional plane VIII, extending between the first cross-sectional plane VI and the second cross-sectional plane VII and parallel to the latter, the gate electrode structures 10 are electrically connected to an edge gate structure 13. The edge gate structure 13 is electrically conductively connected to the gate metallization 14. The edge gate structures 13 and the shielding electrodes 12 are formed from doped polysilicon. The source metallization 15, the gate metallization 14, the edge gate structure 13, the shielding electrode 12 and the semiconductor substrate 16 are respectively insulated from one another by an insulating layer 18, an intermediate oxide layer 22 and a further insulating layer 18.

To fabricate a complex structure, such as the power transistor arrangement described in FIG. 1, in which both the gate electrode structure and the field electrode structure are routed out into the edge region, where they are respectively connected to a gate metallization, or to a source metallization, at least seven patterning planes are required in currently known fabrication methods.

A patterning plane comprises a lithographical mapping of structures prescribed on an exposure mask onto the semiconductor substrate which is to be patterned, followed by etching, deposition or growth and planarization steps.

The at least seven patterning planes for fabricating a power transistor arrangement, in line with FIG. 1, comprise a trench patterning, where cell array and edge trenches are made in the semiconductor substrate, patterning of deposited polysilicon in order to form the field electrode structure, patterning of a gate insulating layer (gate oxide), patterning of a second deposited polysilicon layer to form the gate electrode structure, patterning of body and source regions, patterning of contact holes and patterning of a metal plane.

A great cost factor in each patterning plane is the lithographical mapping, since the appliances needed for this are technically very complex and cost intensive. In addition, the entire mapping process requires high precision and is thus very susceptible to error. For the reasons mentioned, attempts are made to reduce the number of lithographical mapping operations and hence also the number of patterning planes.

Methods are proposed which require only five and only four patterning planes. In the case of the method with five patterning planes, the body and source patterning and also gate electrode patterning planes are eliminated. Lithographical mapping operations are then no longer used either for the body and source patterning or for the gate electrode patterning. The remaining five patterning planes comprise the trench patterning, the field electrode patterning, the patterning of the gate insulating layer, the contact hole patterning and the patterning of the metal plane.

The method with four patterning planes involves the patterning of the field electrode structure and the patterning of the gate insulating layer being combined into one patterning plane. However, the lithographical mapping in this patterning plane makes great demands on alignment tolerance and CD (critical dimension).

The present invention is based on the object of providing an inexpensive method having an even more reduced number of patterning planes for fabricating a power transistor arrangement. The object covers a method for fabricating a power transistor arrangement having a transistor edge termination, and a power transistor arrangement fabricated using the method.

SUMMARY

The invention provides a method for fabricating a power transistor arrangement in which a cell array is provided in a semiconductor substrate. Cell array trenches and also at least one respective connecting trench connected to the cell array trench are made within the cell array. In this case, the cell array trenches are provided in greater width than the connecting trenches. An insulating layer and, on the insulating layer, a first conductive layer are applied. The first conductive layer, which forms a field electrode structure, is taken back. A conductive auxiliary layer is applied, with the connecting trenches at least being filled and the cell array trenches being lined as far as an opening. The conductive auxiliary layer is removed from the cell array trenches essentially completely and is taken back in the connecting trenches essentially as far as the substrate surface. A gate electrode structure is formed in self-aligning fashion in the cell array trenches, and contact is made with the field electrode structure in the region of the connecting trenches connected to the cell array trenches.

The inventive method for fabricating a power transistor arrangement advantageously requires only three patterning planes with one respective lithographical mapping operation. In a first patterning plane, lithographical mapping and subsequent etching processes are used to make the cell array trenches and the connecting trenches in the semiconductor substrate. In this case, the width of the trenches needs to be such that the cell array trenches are wider than the connecting trenches. The substrate surface which has now been patterned has an insulating layer, for example a field oxide, applied to it. A first conductive layer is applied to the insulating layer. The first conductive layer may be applied by conformal deposition of doped polysilicon. The first conductive layer is taken back in order to form a field electrode structure in the cell array trenches. Since no masking is being performed, said layer is taken back both in the cell array trenches and in the connecting trenches. In order to fill the connecting trenches with conductive material as far as a substrate surface, a conductive auxiliary layer is applied. A width ratio between the connecting trenches and the cell array trenches is chosen such that the connecting trenches are at least filled with the auxiliary layer, and the cell array trenches are lined as far as an opening. The conductive auxiliary layer is then removed from the cell array trenches, for example using an isotropic etching process, and is taken back in the connecting trenches essentially as far as the substrate surface. A gate electrode structure is formed in self-aligning fashion without a lithographical mapping process. In a second patterning plane, contact is made with the field electrode structure in the region of the connecting trench, and a metal plane is patterned in a third patterning plane.

The inventive method accordingly involves forming the insulating layer, the field electrode structure, the gate electrode structure and the gate insulating layer in self-aligning fashion without the use of lithographical mapping. This is done by virtue of the invention involving two different trench widths being made in order to define two categories of trenches and by virtue of the conductive auxiliary layer being applied. Narrow dimensions produce the connecting trench with a continuous thicker insulating layer, which may be made of a deposited field oxide, and an electrode made of a polysilicon, for example. Wide dimensions produce the cell array trench with the field electrode structure in the lower part of the cell array trench, which field electrode structure is insulated from the semiconductor substrate by the thicker insulating layer, and with the gate electrode structure in the upper part of the cell array trench, which gate electrode structure is insulated from the semiconductor substrate and the field electrode structure by the thinner gate insulating layer. The electrode structures, which are different in the cell array trench and in the connecting trench, are formed by depositing the conductive auxiliary layer between the deposition of the first conductive layer forming the field electrode structure and of the second conductive layer forming the gate electrode structure. In this case, the thickness of the auxiliary layer needs to be such that the narrower connecting trench is just sealed, while the wider cell array trenches are lined with the auxiliary layer and still have an opening. When the auxiliary layer in the connecting trenches has been taken back as far as the substrate surface and has been removed from the wider cell array trenches, the lower part of the cell array trenches now contains only the first conductive layer, which forms a field electrode structure. The insulating layer may now be removed in the portions which are covered neither by the first conductive layer nor by the auxiliary layer. The gate insulating layer may now be provided in self-aligning fashion by means of oxidation of semiconductor material. The gate electrode structure may be formed by depositing a second conductive layer with a subsequent back-etching process. In a second patterning plane with lithographical mapping, contact holes and contact trenches are provided. A metal plane is patterned in a third patterning plane.

The fundamental advantage of the inventive method is that there is no need for lithographical mapping, which is critical in terms of the alignment and the CD (critical dimension) demands and is susceptible to error. By reducing sources of error, it is possible to make the entire process much less expensive.

To form the gate electrode structure, preferably portions of the insulating layer which are covered neither by the first conductive layer nor by the auxiliary layer are removed. Thereon, a gate insulating layer, for example an oxide, and a second conductive layer are provided. By taking back the second conductive layer as far as the substrate surface, the gate electrode structure is formed from the second conductive layer. The second conductive layer may be applied by conformally depositing doped polysilicon. Said conductive layer is taken back using an isotropic etching process, for example.

Preferably, making cell array trenches and connecting trenches involves making an edge trench, which surrounds the cell array completely, in the semiconductor substrate. The edge trench is provided in the same width as the connecting trench and is processed in the same manner as the connecting trench. It is a simple matter for the inventive method to be used to make an edge trench surrounding the cell array without additional process steps. The edge trench is mapped onto the semiconductor substrate concurrently with the first lithographical mapping operation and in subsequent process steps is lined with the insulating layer and filled with conductive material in the same manner as the connecting trenches. An electrode structure formed with the conductive material in the edge trench may be connected to the field electrode structure in the cell array trench by the connecting trench, for example, and hence may be placed at the same electrical potential as the field electrode structure in the cell array trench. The electrode structure provided in the edge trench advantageously shields a drain potential and protects the gate insulating layer against damage.

Advantageously, formation of the gate electrode structure is followed by an intermediate oxide layer being applied for the purpose of insulation. A source contact trench for conductively connecting source regions formed in the semiconductor substrate and the connecting trenches to a source metallization, at least portions of which are arranged above the cell array, is provided in the intermediate oxide layer and in the semiconductor substrate between two respective cell array trenches. Gate contact holes for conductively connecting the gate electrode structure to a gate metallization, at least portions of which are arranged above the cell array, are made in the intermediate oxide layer. The gate and source metallizations are then provided. The connecting trench is preferably provided running at right angles to the cell array trenches and to the source contact trench. The source contact trench crosses the connecting trenches and thus sets up a conductive connection between the connecting trenches and the source metallization.

Preferably, the material provided for the auxiliary layer is a material which can be removed selectively with respect to the material of the first conductive layer. A material which can be removed selectively simplifies an etching process used to remove the auxiliary layer from the wider cell array trenches.

The material provided for the second conductive layer is preferably doped polysilicon.

The inventive method for fabricating a power transistor arrangement having a transistor edge termination involves a cell array being provided in a semiconductor substrate. Within the cell array, cell array trenches and at least one edge trench which surrounds the cell array and forms the transistor edge termination are made in the semiconductor substrate, the cell array trenches being provided in greater width than the edge trench. An insulating layer is applied. A conductive auxiliary layer is applied to the insulating layer, the edge trench at least being filled and the cell array trenches being lined as far as an opening. The auxiliary layer is removed from the cell array trenches completely and is taken back in the edge trench essentially as far as the substrate surface. The exposed insulating layer is removed and a gate insulating layer is applied. A first conductive layer is applied and the gate electrode structure is formed by taking back the first conductive layer as far as the substrate surface.

The inventive method involves an edge trench which surrounds the cell array and forms a transistor edge termination being concurrently processed in a simple manner without additional lithographical mapping. This is done by providing different trench widths in conjunction with applying a conductive auxiliary layer. A width ratio for edge trench to cell array trench is provided such that the conductive auxiliary layer fills the edge trench and lines the cell array trenches as far as an opening. An isotropic etching process can be used to remove the auxiliary layer from the cell array trenches completely and to take it back in the edge trenches as far as the substrate surface. The insulating layer can now be removed from the cell array trenches and replaced with a gate insulating layer. When the gate insulating layer has been applied, the gate electrode structure is formed. The advantage of this procedure is that the edge trench which is lined with the thicker insulating layer as compared with the gate insulating layer and is provided so as to have an electrode structure is formed concurrently with the processing of cell array trenches without additional lithographical mapping. The inventive method advantageously also allows conventional power transistor arrangements to be provided so as to have a transistor edge termination protecting the gate insulating layer in the cell array, without additional patterning complexity.

Preferably, the gate insulating layer is provided by means of oxidation of semiconductor material. This is done as a self-aligning process, since the insulating oxide is formed only on surface portions of the semiconductor material where the semiconductor material is not covered by other layers. The gate insulating layer is formed on the first conductive layer, which may have been made of a doped polysilicon, and on the surface of the semiconductor substrate.

The insulating layer is advantageously applied by growing or depositing a field oxide and is generally provided in greater thickness than the gate insulating layer.

Advantageously, the first conductive layer is applied by conformally depositing doped polysilicon.

The auxiliary layer is preferably applied using a conformal deposition process and is taken back using an isotropic etching process. A conformal deposition process ensures that a material for the auxiliary layer is also deposited on vertical trench walls.

Preferably, the body and source regions are made in the semiconductor substrate by implanting a dopant and a subsequent temperature step.

Formation of the gate electrode structure is advantageously followed by the performance of a silicidation operation. Silicidation of the gate electrode structure has the advantage that the conductivity of the gate electrode structure is increased.

The cell array trenches advantageously comprise inner cell array trenches arranged parallel to one another and an outer cell array trench. In this case, the outer cell array trench is provided so as to have a portion which is parallel to the inner cell array trenches and a portion which is at right angles to the inner cell array trenches. The inner cell array trenches are connected to the portion of the outer cell array trench which is at right angles, by virtue of the inner cell array trenches opening into the outer cell array trench or crossing it.

Preferably, a minimum distance between the outer cell array trench and the inner cell array trenches is provided in a manner corresponding to a distance between two respectively adjacent inner cell array trenches. The inner cell array trenches and the parallel portion of the outer cell array trench are arranged at one and the same distance from one another.

The outer cell array trench is advantageously provided so as to have finger-like extensions for making contact with the gate electrode structure. Above the finger-like extensions of the outer cell array trench it is possible to provide the gate metallization, which is electrically conductively connected to the gate electrode structure by gate contact holes which are made in the finger-like extensions. Above the inner cell array trenches, along which the trench transistor cells are formed, it is possible to provide a source metallization, the source metallization being electrically conductively connected to the source regions and the connecting trenches by the source contact trenches provided between the parallel cell array trenches.

The edge trench and the outer cell array trench are advantageously connected to one another by the connecting trench. This connection advantageously places the electrode structure in the edge trench at the potential of the field electrode structure in the outer cell array trench.

The inventive power transistor arrangement is provided so as to have a cell array formed in a semiconductor substrate. Within the cell array, cell array trenches are formed in the semiconductor substrate, the cell array trenches comprising a plurality of inner cell array trenches arranged parallel to one another and an outer cell array trench. Trench transistor cells are formed along the inner cell array trenches. Within a respective cell array trench, a gate electrode structure is formed which is insulated from the semiconductor substrate by a gate insulating layer. At least portions of a gate metallization are arranged above the cell array, said gate metallization being electrically conductively connected to the gate electrode structure. At least portions of a source metallization are arranged above the cell array, said source metallization being electrically conductively connected to source regions formed in the semiconductor substrate by source contact trenches. In line with the invention, the power transistor arrangement is provided so as to have an edge trench which surrounds the cell array completely, is lined with an insulating layer and is filled with a conductive material.

In line with the invention, the cell array is surrounded completely by an edge trench which forms a transistor edge termination. The edge trench contains an insulating layer which is thicker than the gate insulating layer. The conductive material forming an electrode in the edge trench is isolated from the semiconductor substrate by the thick insulating layer. The transistor edge termination formed in the inventive manner advantageously shields a drain potential. This prevents damage to the gate insulating layer in the cell array. In addition, the inventively provided edge trench affords the advantage that the entire transistor edge design may be in space-saving form and hence a chip surface area taken up by the power transistor arrangement can be reduced in size.

The insulating layer is preferably thicker than the gate insulating layer. The advantage is that the qualitative demands on a thick insulating layer may turn out to be lower than the demands on a thin gate insulating layer.

A respective cell array trench advantageously contains two electrode structures which are insulated from one another and from the semiconductor substrate. In this case, one electrode structure is in the form of a field electrode structure and the other electrode structure is in the form of a gate electrode structure. The field electrode structure is electrically conductively connected to the source metallization in the region of a respective connecting trench which connects the adjacent parallel cell array trenches. By providing connecting trenches in the cell array, the field electrode structure may be electrically conductively connected, directly in the cell array, to the source metallization arranged above the cell array. There is no need to extend the field electrode structure as far as the edge trench and to connect it conductively to the source metallization at that point. This reduces complexity for the structure given constant functionality of the power transistor arrangement. The conductive connection between the field electrode structure and the source metallization in the cell array simplifies a transistor edge design. A simplified structure also allows a method for fabricating this structure to be simplified.

Preferably, the cell array trenches are provided in greater width than the edge trench and the connecting trenches. The choice of different widths allows different categories of trenches to be defined. The wider cell array trenches contain the field electrode structure, insulated from the semiconductor substrate by the insulating layer, and the gate electrode structure with the gate insulating layer which provides insulation from the semiconductor substrate and the field electrode structure, while the narrower edge trench and the connecting trenches contain the thick insulating layer and the material of the field electrode structure and of the auxiliary layer.

Advantageously, the outer cell array trench is provided so as to have a portion which is parallel to the inner cell array trenches and a portion which is at right angles to the inner cell array trenches. The inner cell array trenches are connected to the portion of the outer cell array trench which is at right angles. In this case, the inner cell array trenches may open into the outer cell array trench or cross it. The gate electrode structure in the inner cell array trenches is electrically conductively connected to the gate metallization by the outer cell array trench.

A minimum distance between the outer cell array trench and the inner cell array trenches preferably corresponds to a distance between two respectively adjacent inner cell array trenches.

Preferably, the edge trench and the outer cell array trench are at a shorter distance from one another than two respective instances of the inner cell array trenches are from one another. This advantageously means that an edge aperture is situated above a cell array aperture.

The outer cell array trench is advantageously provided so as to have finger-like extensions for making contact with the gate electrode structure. The finger-like extensions, in which gate contact holes for conductively connecting the gate electrode structure to the gate metallization are made, provide a simple way of physically separating the source metallization and the gate metallization from one another.

Preferably, connecting trenches which run at right angles to the cell array trenches and connect the adjacent cell array trenches are provided between two respective adjacent cell array trenches. The connecting trenches are electrically conductively connected to the source metallization by the source contact trenches which run parallel to the cell array trenches. This advantageously allows any number of connecting trenches and hence points of contact between the field electrode structure and the source metallization in the cell array to be provided without taking up additional chip area.

Preferably, the connecting trench which connects the edge trench and the outer cell array trench is provided between the edge trench and the outer cell array trench. The connecting trench is not connected to the source metallization by a source contact trench. The connecting trench advantageously connects the edge trench to the field electrode structure in the cell array trench.

The invention is explained in more detail below with reference to FIGS. 1 to 6, in which:

BRIEF DESCRIPTION OF THE DRAWINGS

FIG. 3 shows schematic cross sections through trenches in a power transistor arrangement based on the invention in different stages of an exemplary embodiment in the inventive method, FIGS. 4 to 6 show schematic cross sections through processed trenches in an exemplary embodiment of a power transistor arrangement based on the invention.

DESCRIPTION

Figure 1:
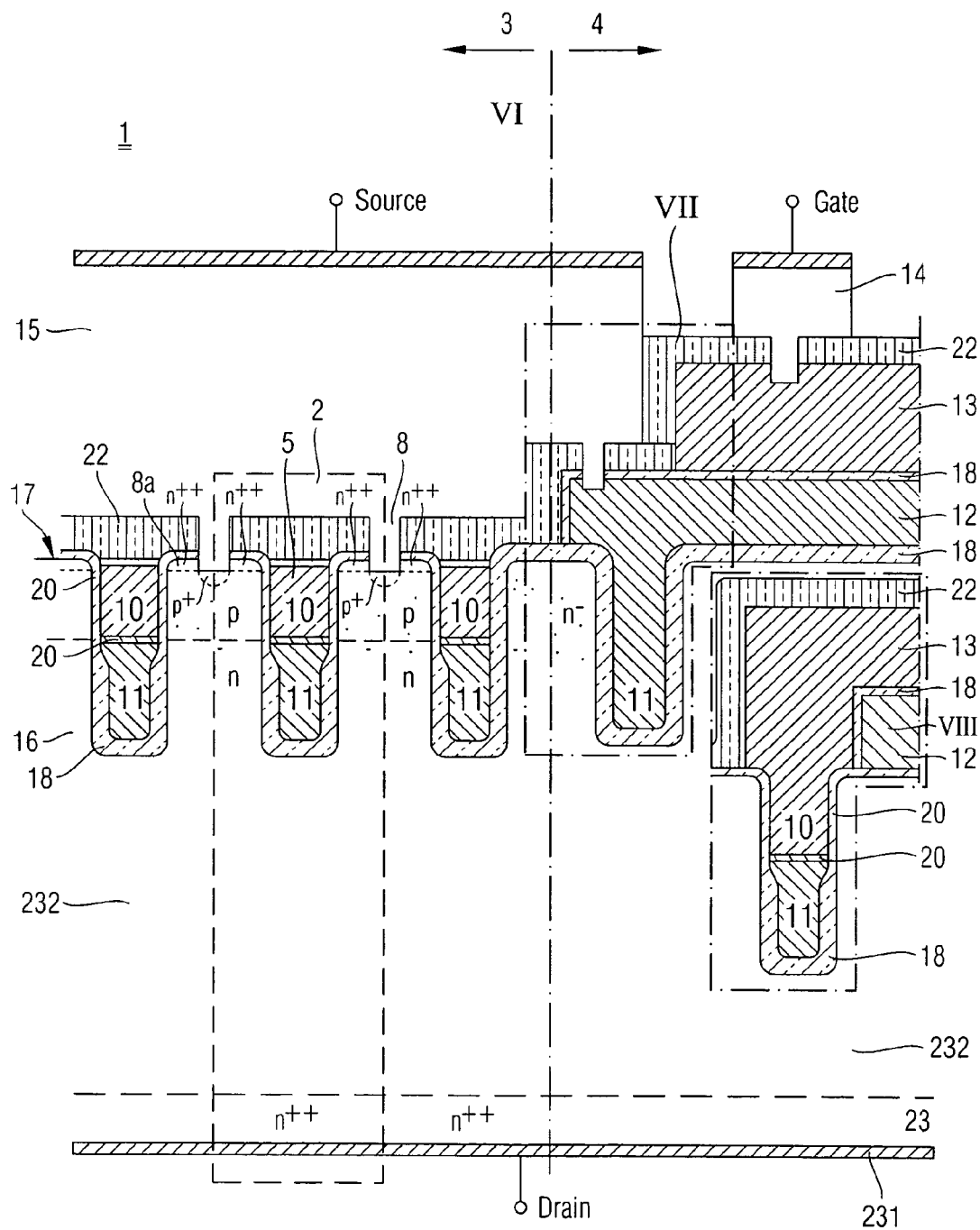
FIG. 1 shows a simplified schematic cross section through a conventional transistor arrangement in the transition region between cell array and edge region.

FIG. 1 has already been explained in more detail in the introduction to the description.

Reference symbols which are not depicted in the figures below can be found in FIG. 1.

Figure 2:
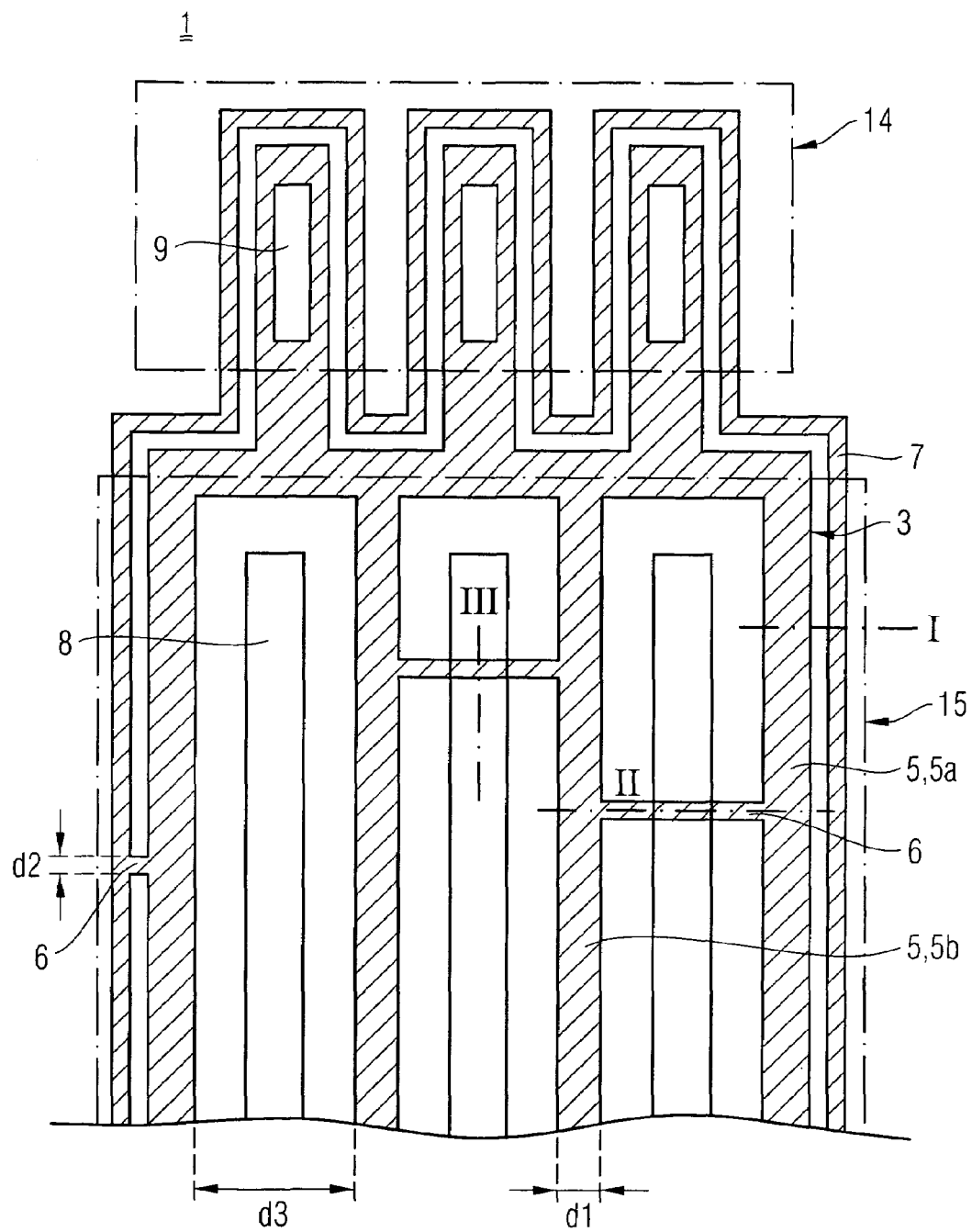
FIG. 2 shows a plan view of a power transistor arrangement in line with an exemplary embodiment of the invention.

The power transistor arrangement 1 shown as an exemplary embodiment in FIG. 2 has a cell array 3 which is formed in a semiconductor substrate 16 and is surrounded by an edge trench 7. Cell array trenches 5 are formed within the cell array 3 in the semiconductor substrate 16. The cell array trenches 5 are divided into inner cell array trenches 5b and an outer cell array trench 5a surrounding the inner cell array trenches 5b. Trench transistor cells 2 are formed along the inner cell array trenches 5b. The inner cell array trenches 5b open into the outer cell array trench 5a. The outer cell array trench 5a has finger-like extensions which contain gate contact holes 9 for conductively connecting a gate electrode structure 10 to a gate metallization 14. The cell array trenches 5 contain two electrode structures which are insulated from one another and from the semiconductor substrate 16. In this case, one electrode structure is in the form of a field electrode structure 11 and the other electrode structure is in the form of a gate electrode structure 10. The field electrode structure 11 is electrically conductively connected to a source metallization 15 arranged above the inner cell array trenches 5b by connecting trenches 6 and by source contact trenches 8. The cell array trenches 5 are provided in a width d1, and the connecting trenches 6 and the edge trench 7 are provided in a width d2 which may be minimal. In this case, the width d2 needs to be such that an electrode structure can be formed in the edge trenches 7 and the connecting trenches 6. The cell array trenches 5 are at a distance d3 from one another.

FIG. 2 shows the cell array 3 and the edge trench 7 surrounding the cell array 3 in the power transistor arrangement 1. The cell array trenches 5 of width d1 are divided into inner cell array trenches 5b and an outer cell array trench 5a.

The gate contact holes 9 are made in finger-like extensions to the outer cell array trench 5a. Provided above the finger-like extensions is the gate metallization 14. In the interspaces between two cell array trenches at a distance d3 from one another, the source contact trenches 8 and, above the source contact trenches 8, the source metallization 15 are arranged parallel to the inner cell array trenches 5b. Running at right angles to the inner cell array trenches 5b are the connecting trenches 6, which are provided in the minimal width d2, like the edge trench 7.

To fabricate a power transistor arrangement 1 in line with the plan view in FIG. 2, lithographical mapping and etching processes are used to make the edge trench 7, the cell array trenches 5 and the connecting trenches 6 in the semiconductor substrate 16 in a first patterning plane. In this case, the cell array trenches 5 are provided in a width of approximately 700 nanometers and the edge trench 7 and the connecting trenches 6 are provided in a width of approximately 350 nanometers.

An insulating layer 18 made of a field oxide is deposited onto or grown on a substrate surface 17 which has now been patterned. A first conductive layer 19 made of a highly doped polysilicon is then applied using a conformal deposition process. The first conductive layer is etched back without masking, the etching depth being approximately 1300 nm after the insulating layer 18.

There then follows further additive deposition of a conductive auxiliary layer 24. The conductive auxiliary layer 24 is removed selectively with respect to the first conductive layer 19 which forms the field electrode structure 11 in the cell array trenches 5. If the auxiliary layer 24 is deposited too thickly, the cell array trench 5 is sealed and the field electrode structure 11 can no longer be formed subsequently. If the auxiliary layer 24 is deposited too thinly, the auxiliary layer 24 fills the edge trench 7 and the connecting trenches 6 incompletely, and the point at which the insulating layer 18 should be covered is exposed.

Following deposition of the auxiliary layer 24, which is performed such that the wider cell array trench 5 is lined with the auxiliary layer 24, and the narrower edge trench 7 and the connecting trenches 6 are filled with the auxiliary layer 24, the auxiliary layer 24 is etched back using an isotropic etching process which defines the position of the insulating layer 18. The exposed portions of the insulating layer 18 are removed using a wet-chemical etching process. A gate insulating layer 20 is applied by means of oxidation of semiconductor material.

In this exemplary embodiment, the semiconductor material is made of the silicon in the semiconductor substrate 16 and of the polysilicon in the first conductive layer 19.

In order to apply the second conductive layer 21 forming the gate electrode structure 10, a highly doped polysilicon is deposited conformally and is then etched back again as far as the substrate surface 17 in the cell array trenches 5. For this back-etching, it is necessary to ensure that polysilicon residues are left neither in the edge trench 7 nor in the connecting trenches 6. This is ensured by means of an over-etching step for the polysilicon.

FIGS. 3a to f show the cell array trench 5 and the edge trench 7, in each case in cross section.

FIG. 3a shows the cell array trench 5 which is etched back into the semiconductor substrate 16 and has a width of approximately 700 nm, and the edge trench 7 which is etched back into the semiconductor substrate 16 and has a width of approximately 350 nm.

The insulating layer 18 and the etched back first conductive layer 19, which ranges in width from approximately 300 to 400 nanometers in the cell array trench 5 and from approximately 100 to 150 nanometers in the edge trench 7, are shown in FIG. 3b.

The cell array trench 5 lined with the auxiliary layer 24 and the edge trench 7 filled with the auxiliary layer 24 can be seen in FIG. 3c.

When the auxiliary layer 24 has been removed from the cell array trenches 5, the height of the field electrode structure 11 in the cell array trenches 5 is defined. An electrode structure in the edge trench 7 is made up of the first conductive layer 19 and the auxiliary layer 24 which has been taken back. FIG. 3d depicts the trenches in this stage of the processing.

FIG. 3e differs from FIG. 3d in that the insulating layer 18 has been removed.

FIG. 3f differs from FIG. 3e by virtue of the gate insulating layer 20 which has been applied through oxidation of semiconductor material and is thinner than the insulating layer 18, and by virtue of the second conductive layer 21, which forms the gate electrode structure 10, in the cell array trench 5.

This novel process control is followed by known standard steps. Following body implantation, body drive, source implantation and healing steps and also an optional silicide step, an intermediate oxide 22 is deposited.

Gate contact holes 9 and source contact trenches 8 are made in a second patterning plane. Besides the body and source regions 8a, the source contact trenches 8 also short the connecting trenches 6 filled with conductive material to a source metallization 15 which needs to be formed in a third patterning plane. In the case of the inventive process control, the gate contact holes 9 are placed not on gate connecting trenches, which contain only the thick insulating layer 18 and a conductive material, but rather on cell array trenches 5, in which a relatively thin gate insulating layer 20 is formed besides a gate electrode structure 11. Since the gate contact hole 9 requires a safety distance from the gate insulating layer 20, a measurement fluctuation in the CD (critical dimension) and the alignment tolerance for this patterning level become crucial. The low complexity in the topology of the three mask process allow both tolerances to be taken to the maximum extent, however. The contact hole patterning is followed by the third patterning plane, in which a source metallization 15 and a gate metallization 14 are provided.

FIG. 4 shows the cross-sectional plane I shown in FIG. 2 with the fully processed edge trench 7 and the outer cell array trench 5a. A lower portion of the outer cell array trench 5 contains the field electrode structure 11 and the insulating layer 18, which insulates the field electrode structure 11 from the semiconductor substrate 16. Arranged above the field electrode structure 11 is the gate electrode structure 10, which is insulated from the field electrode structure 11 and from the semiconductor substrate 16 by the gate insulating layer 20. The edge trench 7 contains the conductive material of the first conductive layer 19 and of the auxiliary layer 24, said conductive material forming an electrode structure. The electrode structure is insulated from the semiconductor substrate 16 by the insulating layer 18. The edge trench 7 is at a shorter distance from the cell array trench 5 than the cell array trenches 5 are from one another. The line shown indicates the profile of an equipotential line. The edge trench 7, which is at a short distance from the cell array trench 5 and is provided so as to have an electrode structure, prevents a drain potential from reaching the gate insulating layer 20 and from being reduced via the gate insulating layer 20, which may result in damage to the gate insulating layer 20. The edge trench 7 shields the sensitive gate insulating layer 20 from the drain potential.

The cross-sectional plane II shown in FIG. 2 is shown in FIG. 5. Two adjacent cell array trenches 5 are made in the semiconductor substrate 16. The cell array trenches 5 are shown in cross section. Running at right angles to the cell array trenches is the connecting trench 6 which connects the cell array trenches 5. The figure shows a longitudinal section through the connecting trench 6. The connecting trench 6 is filled with the first conductive layer 19 and with the auxiliary layer 24 and is insulated from the semiconductor substrate by the insulating layer 18. In the region in which the connecting trench 6 opens into the cell array trenches 5, the connecting trench 6 is insulated from the gate electrode structure 11 by the gate insulating layer 20. Running parallel to the cell array trenches 5 is the source contact trench 8 which crosses the connecting trench 6 and is filled with conductive material. As shown in the figure, the source contact trench 8 makes contact with the conductive material of the auxiliary layer 24 in the connecting trench 6.

Figure 6:
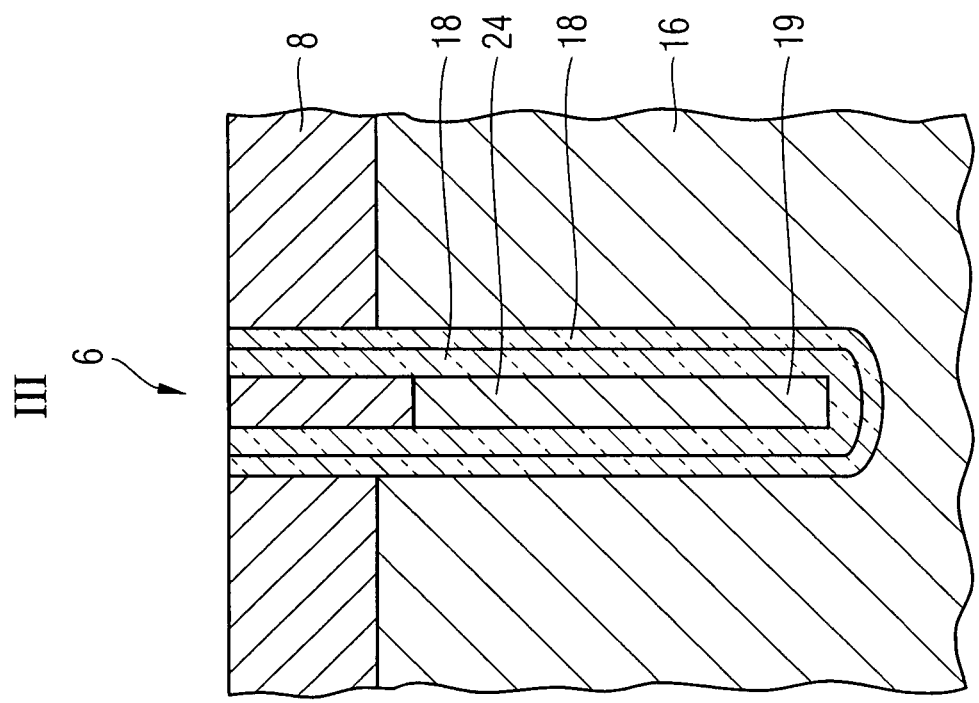

FIG. 6 depicts a cross section along the sectional plane III shown in FIG. 2. In this case, the source contact trench 8 is shown in longitudinal section and the connecting trench 6 which crosses the source contact trench is shown in cross section. The connecting trench 6 is lined completely with the thick insulating layer 18. The connecting trench 6 contains an electrode structure which is made up of the first conductive layer 19 and the auxiliary layer 24. The source contact trench 8 is filled with the conductive material and is used to make contact with source and body regions and to make contact with the connecting trenches 6.

The invention claimed is:

1. A method for fabricating a power transistor arrangement, comprising:

providing a cell array in a semiconductor substrate including a substrate surface;

providing a plurality of cell array trenches and at least one connecting trench connected to the plurality of cell array trenches within the cell array, wherein the width of each of the plurality of cell array trenches is greater than the width of the at least one connecting trench, and wherein the plurality of cell array trenches and at least one connecting trench extend below the substrate surface;

providing an insulating layer on the substrate surface and in the plurality of cell array trenches and at least one connecting trench;

applying a first conductive layer to the insulating layer;

at least partially removing the first conductive layer, wherein the first conductive layer forms a field electrode structure;

applying a conductive auxiliary layer to the insulating layer and the first conductive layer, wherein the at least one connecting trench is filled with the conductive auxiliary layer and the plurality of cell array trenches are lined with the conductive auxiliary layer;

removing the conductive auxiliary layer from the plurality of cell array trenches and at least partially removing the conductive auxiliary layer in the at least one connecting trench; and forming a gate electrode structure in the plurality of cell array trenches;

wherein the field electrode structure contacts a region of the at least one connecting trench, and wherein the at least one connecting trench connects the plurality of cell array trenches.

2. The method as claimed in claim 1 wherein the gate electrode structure is formed by the steps of:
   removing portions of the insulating layer which are covered neither by the first conductive layer nor by the auxiliary layer;
   applying a gate insulating layer;
   applying a second conductive layer; and
   at least partially removing the second conductive layer to substantially the level of the substrate surface in the plurality of cell array trenches.

3. The method as claimed in claim 1 wherein the step of providing a plurality of cell array trenches and at least one connecting trench further includes providing an edge trench, the edge trench surrounding the cell array in the semiconductor substrate, and wherein the width of the edge trench is substantially the same as the width of the at least one connecting trench.

4. The method as claimed in claim 1 wherein the step of forming the gate electrode structure is followed by the steps of:
   applying an intermediate oxide layer;
   providing a source contact trench in the intermediate oxide layer and in the semiconductor substrate between two of the plurality of cell array trenches, the source contact trench operable to conductively connect a source region and the at least one connecting trench to a source metallization;
   providing a plurality of gate contact holes operable to conductively connect the gate electrode structure to a gate metallization, and
   applying the gate metallization and the source metallization.

5. The method as claimed in claim 4 wherein the at least one connecting trench is provided running at right angles with respect to the plurality of cell array trenches and to the source contact trench.

6. The method as claimed in claim 1 wherein the material provided for the conductive auxiliary layer is a material which can be removed selectively with respect to the material of the first conductive layer.

7. The method as claimed in claim 1 wherein the material provided for the second conductive layer is doped polysilicon.

8. A method of making a power transistor arrangement having a transistor edge termination, the method comprising:
   providing a cell array in a semiconductor substrate including a substrate surface;
   providing in the semiconductor substrate a plurality of cell array trenches and at least one edge trench which surrounds the cell array and forms the transistor edge termination, the plurality of cell array trenches being greater in width than the at least one edge trench;
   applying an insulating layer to the substrate surface and in the plurality of cell array trenches and the at least one edge trench;
   applying a conductive auxiliary layer to the insulating layer, wherein the at least one edge trench is filled with the conductive auxiliary layer and the plurality of cell array trenches are lined with the conductive auxiliary layer;
   removing the conductive auxiliary layer from the plurality of cell array trenches and at least partially removing the conductive auxiliary layer in the at least one edge trench to substantially the level of the substrate surface, wherein removal of the conductive auxiliary layer provides exposed portions of the insulating layer;
   removing the exposed portions of the insulating layer;
   applying a gate insulating layer;
   applying a second conductive layer to form a gate electrode structure; and
   at least partially removing the second conductive layer to substantially the level as the substrate surface, thereby forming the gate electrode structure from the second conductive layer.

9. The method as claimed in claim 8 wherein the gate insulating layer is applied by means of oxidation of semiconductor material.

10. The method as claimed in claim 8 wherein the insulating layer is applied by growing or depositing a field oxide.

11. The method as claimed in claim 8 wherein the second conductive layer is applied by conformally depositing doped polysilicon.

12. The method as claimed in claim 8 wherein the conductive auxiliary layer is applied using a conformal deposition process and is at least partially removed using an isotropic etching process.

13. The method as claimed in claim 8 further comprising the step of providing source regions in the semiconductor substrate by implanting a dopant.

14. The method as claimed in claim 8 further comprising the step of performing silicidation of the gate electrode structure following formation of the gate electrode structure.

15. The method as claimed in claim 8 wherein the plurality of cell array trenches comprise inner cell array trenches and an outer cell array trench, wherein the inner cell array trenches are formed parallel to one another, and wherein the outer cell array trench include first trench portions which are formed parallel to the inner cell array trenches and second trench portions which are formed at right angles to the inner cell array trenches, and wherein the inner cell array trenches are connected to the second trench portions of the outer cell array trench.

16. The method as claimed in claim 15 wherein a minimum distance between the outer cell array trench and the inner cell array trenches corresponds to a distance between two adjacent inner cell array trenches.

17. The method as claimed in claim 15 wherein the outer cell array trench includes finger-like extensions arranged and disposed to make contact with the gate electrode structure.

18. The method as claimed in claim 15 wherein the at least one edge trench and the outer cell array trench are connected to one another by a connecting trench.

* * * * *